US006521469B1

(12) United States Patent
La Rosa et al.

(10) Patent No.: US 6,521,469 B1
(45) Date of Patent: Feb. 18, 2003

(54) LINE MONITORING OF NEGATIVE BIAS TEMPERATURE INSTABILITIES BY HOLE INJECTION METHODS

(75) Inventors: Giuseppe La Rosa, Fishkill, NY (US); Fernando J. Guarin, Millbrook, NY (US); Stewart E. Rauch, III, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 09/668,987

(22) Filed: Sep. 25, 2000

(51) Int. Cl.[7] ............................................... H01L 21/66
(52) U.S. Cl. ........................................... 438/17; 438/18
(58) Field of Search ............................... 438/14, 17, 18

(56) References Cited

U.S. PATENT DOCUMENTS

| | | |
|---|---|---|
| 4,420,872 A | 12/1983 | Solo de Zaldivar |
| 4,774,197 A | 9/1988 | Haddad et al. |
| 5,330,920 A | 7/1994 | Soleimani et al. |
| 5,468,657 A | 11/1995 | Hsu |
| 5,589,407 A | 12/1996 | Meyyappan et al. |
| 5,625,288 A | 4/1997 | Snyder et al. |
| 5,674,788 A | 10/1997 | Wristers et al. |
| 5,851,893 A | 12/1998 | Gardner et al. |
| 5,861,335 A | 1/1999 | Hause et al. |
| 5,893,739 A | 4/1999 | Kadosh et al. |
| 5,908,312 A | 6/1999 | Cheung et al. |
| 5,909,622 A | 6/1999 | Kadosh et al. |

OTHER PUBLICATIONS

C. Liu et al., "Mechanism and Process Dependence of Negative Bias Temperature Instability (NBTI) for pMOS-FETs with Ultrathin Gate Dielectrics", Dec. 2001, IEEE IEDM 01, pp. 861–864.*

E. Morifuji et al., "New Considerations for Highly Reliable PMOSFETs in 100 nm Generation and Beyond", Jun. 2001, Syposium on VLSI Technology Digest of Technical Papers, pp. 117–118.*

P. Chaparala et al., "Threshold Voltage Drift in PMOSFETS due to NBTI and HCI", Oct. 2000, IEEE International Integrated Reliability Workshop Final Report, pp. 95–97.*

Y.F. Chen et al., "Negative Bias Temperature Instability (NBTI) in Deep Sub–micron p+–gate pMOSFETs", Oct. 2000, IEEE International Integrated Reliability Workshop Final Report, pp. 98–101.*

B. Doyle, "NBTI–Enhanced Hot Carrier Damage in p–Channel MOSFETs", Dec. 1991, Electron Devices Meeting. IEDM '91, pp. 529–532A.*

S. Ogawa et al, "Impact of Negative–Bias Temperature Instability on the Lifetime of a Single–Gate CMOS Ultrathin (4–6nm) Gate Oxides," J. Appl. Phys. vol. 35 (1996), pp. 1484–1490.

G. La Rosa et al., "NBTI–Channel Hot Carrier Effects in PMOSFETS in Advanced CMOS Technologies," Reliability Physics Symposium, IEEE International (1997), pp. 282–286.

* cited by examiner

*Primary Examiner*—Michael Sherry
*Assistant Examiner*—Evan Pert
(74) *Attorney, Agent, or Firm*—RatnerPrestia; H. Daniel Schnurmann (57) ABSTRACT

A process for in-line testing of a metal-oxide-semiconductor field effect transistor (MOSFET) device for negative bias thermal instability (NBTI), which degrades the gate oxide of the MOSFET device. The process generally comprises four steps. First, a hole injection method is selected that produces approximately the same gate oxide degradation as the NBTI under test. Second, a correlation is established between the NBTI degradation and device shifts due to the selected hole injection degradation method. Third, an in-line procedure is developed based on the hole injection method, using the second step to relate the measured shift to NBTI. Finally, a NBTI specification is defined based on the hole injection method using the second step. The MOSFET device is preferably a p-type MOSFET device and the hole injection method is preferably a channel hot-carrier stress method.

20 Claims, 4 Drawing Sheets

LINE MONITORING OF NEGATIVE BIAS TEMPERATURE INSTABILITIES BY HOLE INJECTION METHODS

TECHNICAL FIELD

The present invention relates generally to wafer-level reliability testing of semiconductor devices and, more particularly, to accelerated metal-oxide-semiconductor field effect transistor (MOSFET) testing for negative bias temperature instability (NBTI) effects.

BACKGROUND OF THE INVENTION

There are two major types of FET devices, the metal-oxide-semiconductor field effect transistor or MOSFET (also called an insulated-gate FET, or IGFET), and the junction-gate FET, or JFET. An FET has a control gate and source and drain regions formed in a substrate. The control gate is formed above a dielectric insulator that is deposited over the area between the source and drain regions. As voltage is applied to the control gate, free carriers in the substrate form a conduction channel in the region between the source and drain regions. Once the channel forms, the transistor turns "on" and current may flow between the source and drain regions.

Transistors are used as either amplifying or switching devices in electronic circuits. In the first application, the transistor functions to amplify small ac signals. In the second application, a small current is used to switch the transistor between an "on" state and an "off" state.

In recent years, the computer industry has experienced extremely rapid growth in all aspects, including number of units produced, breadth of applications, power and speed of operation, and complexity of computing machines. This growth is attributable to many factors, including remarkable increases in the number of active devices (typically transistors) included in the integrated circuit devices used in computers. By increasing the number of transistors in an integrated circuit device, the size of a computer may be reduced, or a more complex computer may be made within a particular computer case size. In addition, by increasing the number of transistors in an integrated circuit device, operational problems such as cross talk between physically adjacent conductors and signal propagation delays between different sections of the computer can be reduced. Further, integrated circuit devices are typically less expensive and more reliable than counterparts manufactured from discrete components. For these and many other reasons, the use of integrated circuit devices of increasing complexity has become the standard of the computer industry.

The trend toward more complex integrated circuits has resulted in increasing density of individual devices within the integrated circuit. To increase the number of individual devices within an integrated circuit, it is necessary to decrease the size of each individual device. The size of individual devices cannot be reduced arbitrarily. There are limitations to size reduction, including dimensional tolerance capabilities associated with manufacturing processes and various electrical phenomena that are associated with physical dimensions of the device. In addition, the essential need for high reliability of integrated circuits places limitations on shrinking the size of such devices. The steps of identifying these and other limitations and discovering techniques for ameliorating these limitations have made possible the increasing complexity of integrated circuits.

The prior art in the field of manufacture, testing, and use of MOSFET devices has identified several problems that occur during long-term use of such devices. Of particular concern is negative bias temperature instability (NBTI). NBTI in a MOSFET is a serious detriment to the long-term stability of the MOSFET, particularly p-type transistors and complementary metal oxide semiconductor (CMOS) devices having $p^+$ polycrystalline silicon gates. NBTI results from charge buildup at the silicon—silicon oxide interface and is due to the influence of negative voltages on the gate electrode of MOS structures. As explained in an article titled "Impact of Negative Bias Temperature Instability on the Lifetime of Single-Gate CMOS Structures with Ultrathin (4–6 nm) Gate Oxides," by Shigeo Ogawa et al., appearing in the Japanese Journal of Applied Physics, vol. 35, pt. 1, no. 2B, page 1484 (1996), the phenomenon arises after long-term stressing of the MOSFET at elevated temperatures and generally occurs even in low fields ($6 \times 10^6$ volts/cm or less).

This instability is particularly pronounced in $p^+$ polycrystalline silicon gate MOS structures, and was studied in the past extensively during the early stages of MOS transistor development. More recently, particularly with the development of high-speed MOS devices having gates with thin oxide layers, often less than 5 nm, there has developed a need for reliable testing techniques for such ultrathin oxides. One of the tests used to determine the life of devices having such thin oxide layers is a bias-temperature test and is based on NBTI of MOS structures. This test is performed at elevated temperature, although under constant voltage. The current state of the art achieves the necessary elevated temperature primarily by heating a wafer in a heating chuck. Such heating requires a long testing period to uniformly heat the wafer.

In U.S. Pat. No. 5,625,288 issued to Snyder et al., there is disclosed a different way to heat a test element. As shown in this reference, a polysilicon heater pad is placed near the test line. This configuration permits heating the test line without needing to raise the temperature of the full wafer. Although the placement of heating pads adjacent the test element provides an obvious reduction in the time needed to raise the temperature of the test element, particularly when the test element is a thin line that is placed along the length of the heating pad, this technique still involves conductive heating of the wafer area containing the test element. When the test element is a MOSFET, the pads must heat an area sufficiently large to contain the full transistor structure so as to assure that the gate oxide layer has reached the desired temperature. Consequently, the process is again time consuming.

There is thus a need in the art of reliability testing of MOSFET devices for improvement in the processes used to test for NBTI, which degrades the gate oxide of the MOSFET device, preferably without having to heat the full wafer on which the transistor is built. There is also a need for an NBTI test procedure that is sufficiently quick and cost-effective that the procedure can be applied to monitor NBTI on every lot in a semiconductor manufacturing line.

SUMMARY OF THE INVENTION

To meet these and other needs, and in view of its purposes, the present invention provides a process for in-line testing of a MOSFET device for NBTI. The process generally comprises four steps. First, a hole injection method is selected that produces approximately the same gate oxide degradation as the NBTI under test. Second, a correlation is established between the NBTI degradation and device shifts due to the selected hole injection degradation method. Third, an in-line procedure is developed based on the hole injection method, using the second step to relate the measured shift to NBTI. Finally, a NBTI specification is defined based on the hole injection method using the second step. The MOSFET device is preferably a p-type MOSFET device and the hole injection method is preferably a channel hot-carrier stress method.

It is understood that the foregoing summary and the following detailed description of the invention are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, dimensions of various features shown in the drawing have been arbitrarily expanded or contracted for clarity. Included in the drawing are the following figures.

DETAILED DESCRIPTION OF THE INVENTION

The present invention provides an in-line process for accelerated testing of MOSFET devices, especially p-type metal-oxide-semiconductor field effect transistor (PMOSFET) devices, for negative bias temperature instability (NBTI) effects. Described in detail below is a representative PMOSFET device, including its components, function, and process of manufacture. A phenomenon known as the hot-carrier ("HC") effect and the in-line tests designed to identify and measure the extent of HC degradation in wafers manufactured using a particular process are next described. There follows a description of the NBTI effect and, more particularly, the practical problems experienced in developing an in-line test for NBTI. Finally, described in detail is the solution to those problems as provided by the present invention.

A. PMOSFET Devices

Figure 1:
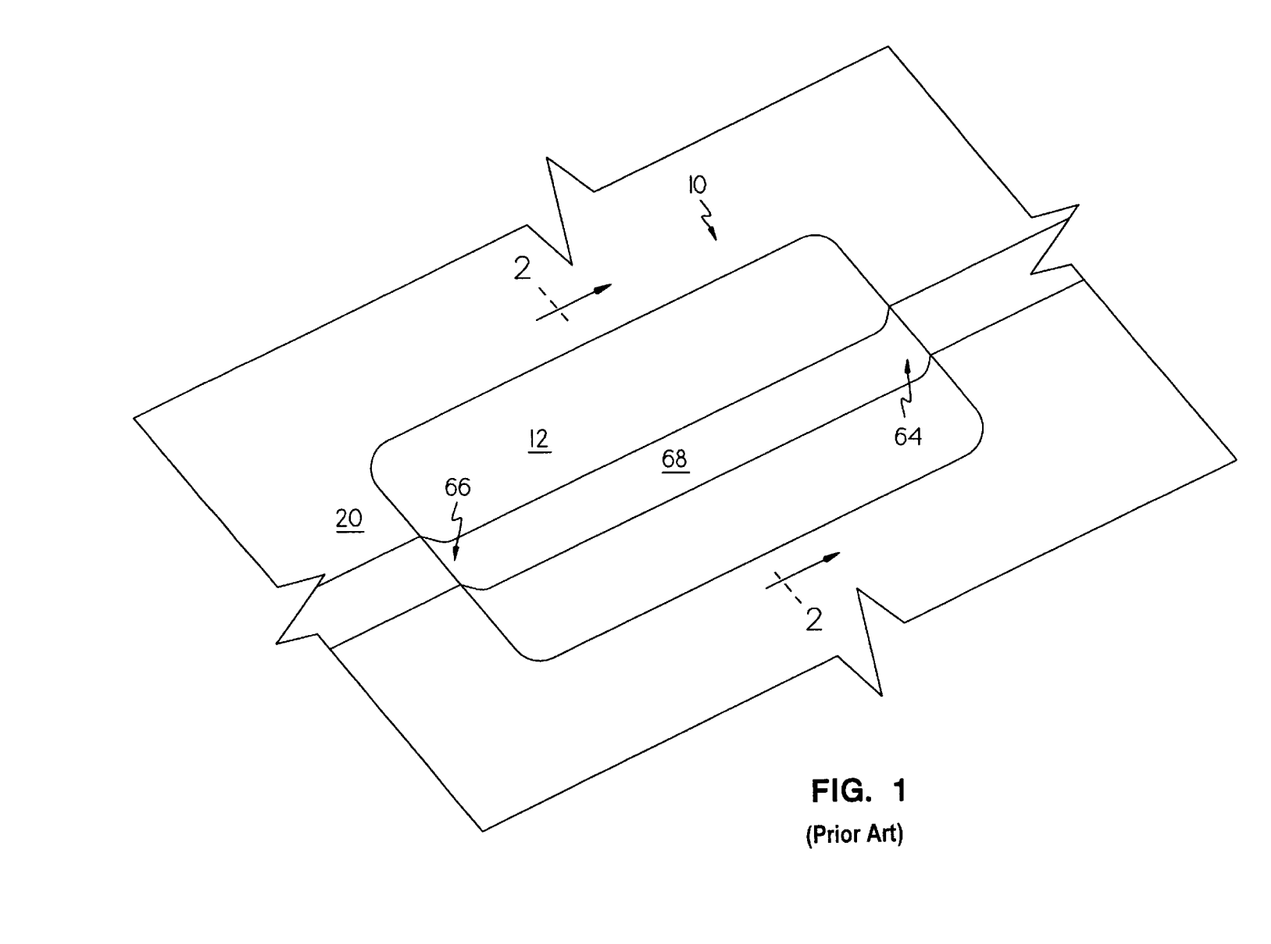
FIG. 1 illustrates, in schematic form, a perspective view of an individual PMOSFET device (an integrated circuit might be comprised of many such individual devices)

Referring now to the figures, in which like reference numbers refer to like elements throughout, FIG. 1 depicts a representative PMOSFET device 10, which may be a discrete device or part of an integrated circuit. A cross section through the device 10 is shown schematically in FIG. 2. In this particular embodiment of the PMOSFET device 10, the device 10 has been constructed on the surface of a piece of single crystal silicon 12 surrounded by an isolation oxide 20. This type of design and construction is often termed shallow trench isolation (STI), or local oxidation of silicon (LOCOS).

Figure 2:
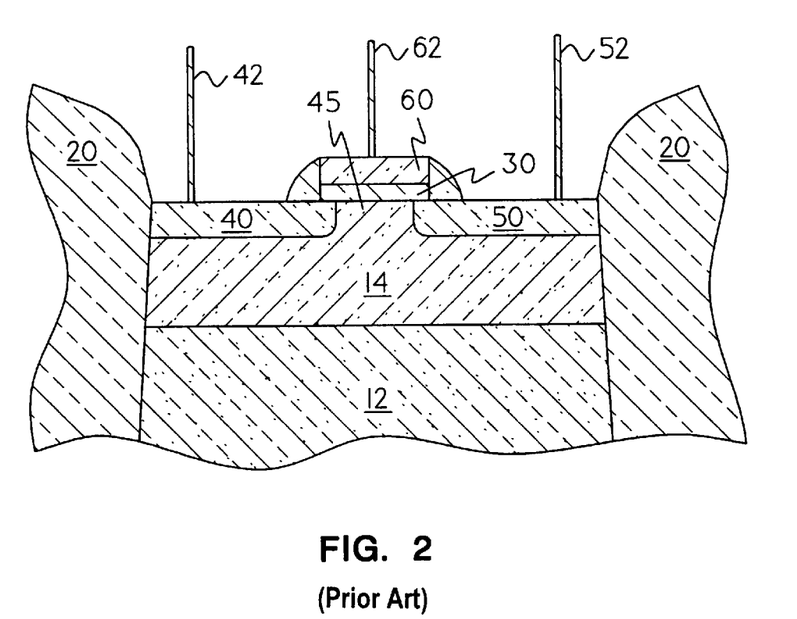
FIG. 2 illustrates, in schematic form, a cross section through the section plane identified as 2—2 in FIG. 1, which is generally perpendicular to the surface of the device and the gate section of the device.

During manufacturing of the device 10, the surface of the single crystal silicon 12 is doped with an element such as phosphorus, arsenic, or antimony to create a zone of n-type silicon 14 (see FIG. 2). An electrically nonconductive substance, typically silicon dioxide, which represents a preferred embodiment of the present invention, is used as the isolation oxide 20 to provide electrical isolation from other active devices fabricated on the same silicon substrate. A thin insulation layer 30, typically silicon dioxide or silicon nitride, is applied to the top of the n-type silicon 14; portions of this oxide insulation layer 30 are subsequently stripped away to expose source and drain regions of the device, 40 and 50, respectively. The remaining portion of the insulating layer 30 may be termed the gate oxide layer. A layer of polycrystalline silicon, applied above the gate oxide layer, forms the gate 60. The side wall-corner interfaces 64 and 66 are located at both ends of the gate 60 and are distinguishable from the main section 68 of the gate 60 between the two side walls.

Electrical connections between other components of an integrated circuit and the source 40, drain 50, and gate 60 are shown schematically at 42, 52, and 62, respectively. In practice, these connections may be layers of metallic materials deposited onto selected portions of an integrated circuit to interconnect the various elements of the circuit, as required by the design of the circuit. The source 40 and drain 50 are doped, typically by the diffusion of boron, to become p-type semiconductors. A region of the single crystal silicon lying between the source 40 and drain 50 and beneath the gate insulation layer 30 is carefully maintained as n-type material and forms the channel 45. Electric current can flow through a PMOSFET device between the source and drain when a sufficient negative voltage is applied to the gate 60. This is the basic function of the FET.

As is well known in the art, if the impurity dopant material used for forming the source and drain regions is n-type, then the resulting MOSFET device is an n-type or NMOSFET device. Integrated circuits use either n-type devices exclusively, p-type devices exclusively, or a combination of both on a unitary monolithic substrate. Although both types of devices can be formed, the devices are distinguishable based on the source and drain impurity dopant.

B. The Hot-Carrier Effect

A phenomenon known as the hot-carrier ("HC") effect can occur in both NMOSFET and PMOSFET devices. The HC effect is a phenomenon by which the kinetic energy of the carriers (holes or electrons) is increased as they are accelerated through large potential gradients and subsequently become trapped within the gate oxide. The greatest potential gradient, often referred to as the maximum electric field, occurs near the drain during saturated operation. More specifically, the electric field is predominant at the lateral junction of the drain adjacent the channel.

Using the NMOSFET device as an example, the electric field at the drain causes channel electrons to gain kinetic energy and become "hot." Some of these hot electrons have enough energy to create electron-hole pairs through impact ionization of the silicon atoms. Electrons generated by impact ionization join the flow of channel electrons, while the holes flow into the bulk to produce a substrate current in the device. The substrate current is the first indication of the creation of hot carriers in a device. For PMOSFET devices, the fundamentals of the process are essentially the same except that the roles of holes and electrons are reversed.

The HC effect occurs when some of the hot carriers are injected into the gate oxide near the drain junction, where they induce damage in the form of fixed charge and interface traps. HC degradation in MOSFET devices can take place either by electron or hole injection depending on the biases applied during stress. Hot hole damage is the dominant HC degradation mechanism in PMOSFET devices in deep submicron technologies. See the article titled "NBTI-Channel Hot Carrier Effects In PMOSFETS In Advanced CMOS Technologies," by G. La Rosa et al., appearing in Reliability Physics Symposium, 35th Annual Proceedings, IEEE International, page 282 (1977). This damage results in positive fixed charge formation and interface state generation in the gate which, in turn, produces a negative device threshold voltage shift during stress (i.e., the device is harder to turn on). Although localized, this damage is similar to the damage experienced by PMOSFET devices during an NBTI stress.

U.S. Pat. Nos. 5,893,739 and 5,909,622 describe the deleterious effects of hot carriers, whether holes or electrons, that can accumulate in the gate oxide layer and raise the threshold voltage of the MOSFET device. The transistors produced according to the disclosures of these two patents feature asymmetrical construction, with a wider barrier between the gate and drain than between the gate and source. U.S. Pat. No. 5,851,893 teaches a mechanism to control HC effects by injecting barrier atoms into the silicon beneath the gate edge near the drain. U.S. Pat. No. 5,861,335 teaches implanting nitrogen into the silicon substrate on either side of the channel region, where such implantation is done concurrently or after the doping of the source and drain regions.

In any event, HC effects present a reliability concern. This concern has prompted development of in-line HC tests designed to identify and measure the extent of HC degradation in wafers manufactured using a particular process. Typically, the HC tests involve accelerated injection of hot holes in the PMOSFET device gate oxide. Such tests are compatible with the practical limitations (e.g., temperature and time) placed on in-line tests.

C. Negative Bias Temperature Instability

NBTI is another critical problem undermining the reliability of PMOSFET devices of advanced, submicron CMOS technologies. In fact, NBTI is one of the key limiting reliability factors in developing ultrathin gate oxide (oxides with a thickness less than bout 30 Å) CMOS technologies because the gate oxide electric field does not typically scale with the gate oxide thickness. The result of NBTI degradation is a reduction in PMOSFET performance, as explained in the article by Shigeo Ogawa et al. mentioned above.

One important aspect of this reliability problem is the large variability (or scattering) of the NBTI degradations shown by hardware manufactured using the same process steps and stressed in the same way. This NBTI variability requires implementation of an effective in-line screening test to prevent NBTI-related failures in the field. Because NBTI is a strongly thermally activated process, the stress time needed to produce a significant device performance shift is too large for implementation of a NBTI screening test during a manufacturing in-line test operation. More specifically, typical in-line monitoring schemes are implemented at a relatively low temperature (25–85° C.) and are expected to be run for a length of time (seconds) too short to obtain significant NBTI degradation (which takes hours). This in-line test requirement renders impractical the direct implementation of an in-line method to measure the NBTI variability, and disposition hardware accordingly, in a reasonably short period of time.

D. In-Line Monitoring of NBTI by Hole Injection Methods

The process of the present invention achieves an effective, practical, and reliable in-line monitoring of the NBTI damage in PMOSFET devices. The process has as its foundation the observation that hole injection with consequent positive charge formation and interface state generation at the silicon—silicon oxide interface of the gate oxide of PMOS- FET devices is the main mechanism responsible for the generation of NBTI damage. In addition, a correlation has been observed between the NBTI damage and channel HC degradation in the hole injection regime (Vgate=Vdrain) in PMOSFET devices.

Figure 3:
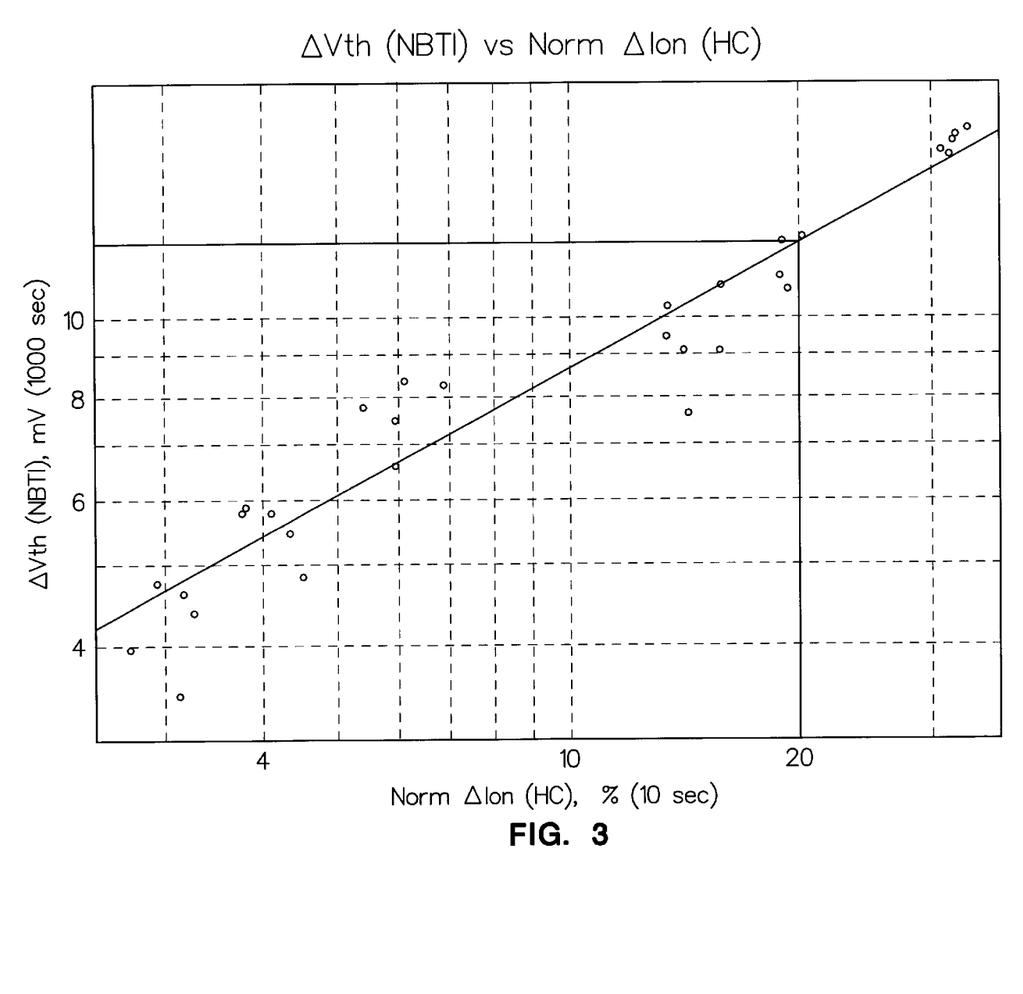
FIG. 3 is a graph illustrating the correlation between hot-carrier degradation and NBTI degradation.

FIG. 3 shows the correlation between normalized HC degradation (measured as a percentage shift in drain current, Id, induced by HC injection; reverse saturation) of short channel devices stressed at a Vgate=Vdrain condition and NBTI degradation (measured as a shift in threshold voltage, Vth, induced by NBTI stress at worst circuit conditions; reverse saturation) of long channel PMOSFET devices for gate oxide process splits of a given CMOS technology. The long channel PMOSFET device is selected to track the NBTI degradation because it is not sensitive to HC degradation during the stress, while the short channel device is used to track only HC degradation. Tests were run at 40° C. and, as shown in FIG. 3, the correlation can be represented by a straight line. The in-line specification limit based on a channel HC in-line stress of 20% corresponds to the maximum Vth shift from the NBTI stress allowed by end-of-life NBTI reliability targets.

The correlation shown by FIG. 3 represents a link between the HC degradation after 10 seconds stress and the NBTI degradation after 1,000 seconds stress. That link exists because both types of degradation are controlled by interface state generation due to hole damage. The NBTI variation also tracks the HC variability of the PMOSFET short channel devices. Thus, wafer-level channel HC hole injection (Vgate=Vdrain) in PMOSFET devices is a very fast and effective method of producing an equivalent NBTI damage even if localized around the drain area of the device instead of uniformly distributed along the device channel as in the standard NBTI capacitor-like stress (Vgate<0; Vsource=Vdrain=Vn-well=0).

The process of the present invention uses alternative methods to produce hole injection in the gate oxide of PMOSFET devices as a way to accelerate NBTI degradation. These hole injection methods are not thermally activated and, therefore, can be made fast enough to justify their use as NBTI in-line monitors. The oxide damage produced by hole injection will be the same independently of the source used for hole injection. Both localized hole injection methods, such as NMOSFET HC at hole injection conditions (Vgate around Vth) or PMOSFET HC at hole injection conditions (Vgate around Vdrain), and uniform injection methods, such as hole substrate injection (LITS stress), can effectively be used to develop the NBTI in-line monitoring process. Various other hole injection methods are also suitable and are within the knowledge of the skilled artisan.

Generally, then, the process of the present invention includes the following steps. First, during the evaluation of a given technology, a particular hole injection method is selected. The hole injection method must effectively produce approximately the same gate oxide damage as NBTI. The selection depends on the key features of the technology under investigation. For instance, NFET HC hole injection methods are suggested for $n^+$ single work function technologies; both PMOS and NMOS HC hole injection methods can be used for dual work function technologies.

Second, a correlation is established between the NBTI degradation and the device shifts due to the selected fast degradation hole injection method. This correlation is assumed applicable to a mature technology suitable for manufacturing. Third, an in-line procedure is developed based on the fast hole injection method and the second step is used to relate the measured shift to NBTI. Finally, the correlation established in the second step is used to define a NBTI specification based on the fast hole injection method.

Figure 4:
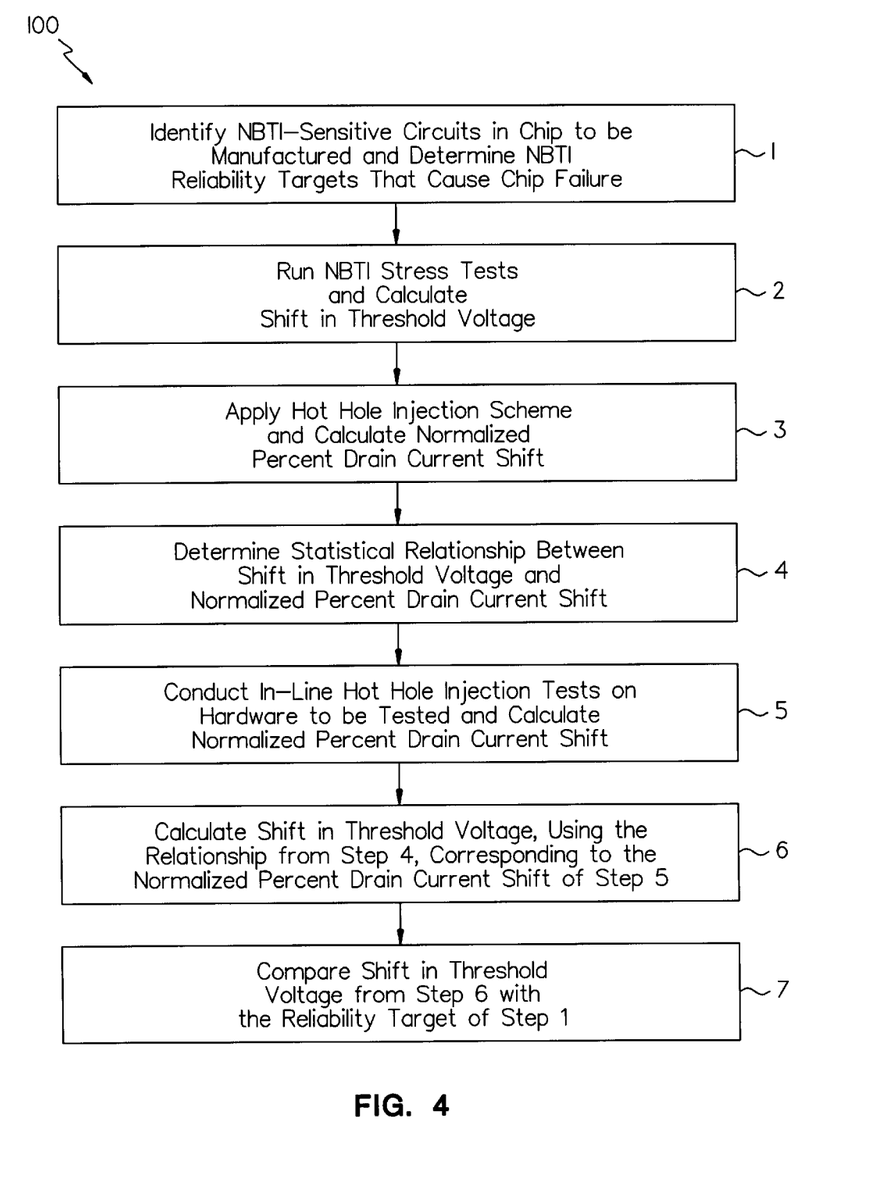
FIG. 4 is a flow chart illustrating the exemplary steps of an in-line testing process according to the present invention.

A more specific illustration of the process of the present invention is provided in FIG. 4. The steps of the process 100 are described below in detail with reference to FIG. 4.

STEP 1

First, the critical circuits in the chip to be manufactured, which are sensitive to the NBTI damage, are identified in Step 1. Analog circuits, differential amplifiers, and sense amplifiers are examples of circuits that are very sensitive to NBTI degradation. The NBTI reliability targets, which will make the chip fail, are also determined in Step 1. A shift in threshold voltage ($\Delta$Vth) is determined which relates to the end-of-life NBTI reliability criteria. The threshold voltage shift in reverse saturation test is suggested for use as a measure of NBTI degradation. The reverse saturation test is but one example, however, of a test that can reveal NBTI degradation. The threshold voltage shift can be measured in another test mode, with the reliability target for NBTI defined based on circuit sensitivities. For example, if a given circuit is sensitive to threshold voltage shift due to NBTI in a linear mode, then the threshold voltage shift target must be defined in that way.

STEP 2

In Step 2, NBTI capacitor-like stress tests are conducted in long channel PMOSFET devices. The chips stressed must be selected randomly from wafers which represent the manufacturing process tolerances of the PMOSFET device in the technology under investigation. Certain process parameters determine the NBTI sensitivity, such as the variation in gate oxide thickness, the amount of boron penetration at the gate oxide-silicon interface, and the like. These process parameters must be monitored.

The stress conditions are as follows. The gate voltage (Vgate) is the worst voltage of PMOSFET devices in the critical circuit which are sensitive to NBTI damage. Typically, Vgate is the voltage at burn in. The source voltage (Vsource) is equal to the drain voltage (Vdrain) and the well voltage (Vwell) and all are 0V. The stress can be applied either at the wafer or the module level. The temperature is the highest temperature experienced by the circuits. Finally, the time of stress ($t_{stress}$) is the time needed to reach a threshold voltage (Vth) shift equal to the NBTI reliability target.

Vth is measured in reverse saturation with Vsource=Vuse, Vdrain=Vnwell=0 and Vgate at the selected drain current. The shift in Vth ($\Delta$Vth) is calculated as follows:

$$\Delta Vth = Vth(t_{stress}) - Vth(0) \quad (Vth \text{ shift}) \quad \text{(Equation 1)}.$$

STEP 3

In Step 3, channel HC stresses are applied in a hot hole injection regime to short channel PMOSFET devices. The channel HC stresses must be run on the same chips that are used in Step 2, but in short channel devices manufactured as the PMOSFET devices used in Step 2 to enhance channel HC degradation.

The stress conditions are as follows. Vgate=Vdrain; the stress voltage must be large enough to allow significant shift within the allowed in-line testing time. Vsource=Vnwell= 0V. This stress should be done at the wafer level. The temperature at which the stress is applied should be the in-line test temperature. The time of stress is defined as the amount of in-line testing time allowed (1–10 seconds).

The drain current (Id) is measured in reverse saturation with Vsource=Vgate=Vuse, Vdrain=Vnwell=0. The n-well current at stress (Inw(stress)) is also measured. Certain calculations can then be made as follows.

$$\text{The percent } Id \text{ shift in reverse saturation} = \left(\frac{\Delta Id}{Id}\right).$$

The slope (m) of the $$\log\left(\frac{\Delta Id}{Id}\right)$$

versus log(Inw) curve.

Normalized percent drain current shift ($\Delta$I) is:

$$\Delta I = \frac{\frac{\Delta Id}{Id}}{Isx(stress)} = \frac{\frac{Id(stress) - Id(0)}{Id(0)}}{(Inw(Stress))^m}. \quad \text{(Equation 2)}$$

STEP 4

In Step 4, the correlation is established between the NBTI Vth shift calculated from Equation 1 in Step 2 and the normalized percent drain current shift calculated from Equation 2 in Step 3. A statistical linear fit is obtained of the log($\Delta$Vth) (see Step 2) versus log($\Delta$I) (see Step 3) data. The linear fit parameters A and B are estimated so that:

$$\Delta Vth = 10^A \times \Delta I \quad \text{(Equation 3)}$$

This relation is assumed stable in a technology mature for manufacturing. Therefore, the validity of the relation must be confirmed statistically with a large sample size as considered in Step 2. Equation (3) should be determined during the technology qualification process or any time a significant change (a change believed to impact NBTI) is implemented in the PMOSFET device process. Thus, Steps 2, 3, and 4 determine the fundamental relation (Equation 3) that is used to establish the proposed NBTI monitor during in-line testing.

STEP 5

In Step 5, in-line channel HC wafer-level stress tests are conducted on short channel PMOSFET devices as given in Step 3 in the hardware to be tested. A reasonable number of chips should be selected randomly from each wafer to be in-line tested and the test should be run at last metal. The normalized Id shift ($\Delta$I) is calculated from these tests.

STEP 6

In Step 6, calculate the NBTI $\Delta$Vth shift from Equation (3) once the normalized Id shift ($\Delta$I) is calculated following Step 5.

STEP 7

Finally, in Step 7, the screening criterion is evaluated. A comparison is made between $\Delta$Vth, calculated in Step 6, with $\Delta$Vth(reliability target), as determined in Step 1. The evaluation is passed (and, therefore, the hardware under evaluation approved) if abs($\Delta$Vth)>abs($\Delta$Vth(reliability target)).

The process according to the present invention provides a practical, cost-effective way to monitor NBTI on every lot in a semiconductor manufacturing line. The alternative would be to run time-consuming NBTI stress tests, which take between 1 and 300 hours to complete, on selected wafers outside the manufacturing line. Clearly, the process of the present invention offers a significant advantage.

Although illustrated and described above with reference to certain specific embodiments, the present invention is nevertheless not intended to be limited to the details shown. Rather, various modifications may be made in the details within the scope and range of equivalents of the claims and without departing from the spirit of the invention. For example, channel HC stress is only one suitable method able to accelerate hot hole injection in the PMOSFET device gate oxide and produce an equivalent NBTI damage.

Other possible methods can be used to track NBTI during in-line testing that are based on accelerated hot hole injection techniques. A selection of hot hole injection methods alternative to channel HC stress as discussed in Step 5 is strongly dependent on the key features of the technology under investigation and on the possibility of establishing a relation such as Equation 3 in Step 4. NFET HC hole injection methods are, for instance, suggested for $n^+$ single work function technologies, while for dual work function technologies both PMOS and NMOS HC hole injection methods can be used. Substrate hot hole injection methods can also be used as an alternative to produce equivalent NBTI damage. The present invention is not restricted to channel HC at Vd=Vg conditions as the only method to accelerate hot hole injection. Whatever hot hole injection method is used, the in-line NBTI monitoring procedure described in Steps 1 and 7 still applies.

What is claimed:

1. A process for in-line testing of a metal-oxide-semiconductor field effect transistor (MOSFET) device for negative bias thermal instability (NBTI), which degrades the gate oxide of the MOSFET device, the process comprising:
    (a) selecting a hole injection method that produces approximately the same gate oxide degradation as the NBTI under test;
    (b) establishing a correlation between the NBTI degradation and device shifts due to the selected hole injection degradation method;
    (c) developing an in-line procedure based on the hole injection method, using step (b) to relate the measured shift to NBTI; and
    (d) defining a NBTI specification based on the hole injection method using step (b).

2. The process according to claim 1 wherein the MOSFET device is a p-type MOSFET device.

3. The process according to claim 1 wherein the hole injection method is a channel hot carrier stress method.

4. A process for in-line testing of a metal-oxide-semiconductor field effect transistor (MOSFET) device for negative bias thermal instability (NBTI), which degrades the gate oxide of the MOSFET device, during manufacture of an integrated circuit, the process comprising:
    (a) identifying the critical circuits of the integrated circuit to be manufactured that are sensitive to NBTI damage;
    (b) determining the NBTI reliability targets which will make the integrated circuit fail, including a shift in threshold voltage (ΔVth) which relates to the end-of-life NBTI reliability criteria;
    (c) conducting NBTI stress tests in long channel MOSFET devices;
    (d) measuring threshold voltage (Vth) based on the NBTI stress tests;
    (e) calculating threshold voltage shift (ΔVth) from the measured threshold voltage values;
    (f) injecting hot carriers in short channel MOSFET devices to apply channel hot-carrier stresses;
    (g) measuring drain current based on the applied hot-carrier stresses;
    (h) calculating the normalized percent drain current shift (ΔI) from the measured drain current;
    (i) establishing the correlation between the NBTI threshold voltage shift calculated in Step (e) and the normalized percent drain current shift calculated in Step (h);
    (j) conducting in-line channel hot-carrier wafer-level stress tests on short channel MOSFET devices in the integrated circuits to be tested;
    (k) calculating the normalized percent drain current shift from the tests run in Step (6);
    (l) calculating the threshold voltage shift from the correlation established in Step (i) for the normalized percent drain current shift calculated in Step (k); and
    (m) evaluating the screening criterion.

5. The process according to claim 4 wherein the stress conditions applied in step (c) include a gate voltage equal to the voltage at burn in; a source voltage equal to the drain voltage and the well voltage and all are 0V; a temperature set at the highest temperature experienced by the integrated circuit in use; and a time of stress equal to the time needed to reach a threshold voltage shift equal to the NBTI reliability target.

6. The process according to claim 5 wherein the threshold voltage is measured in reverse saturation with the source voltage, drain voltage, and well voltage equal to zero and the gate voltage at the selected drain current.

7. The process according to claim 6 wherein the threshold voltage shift is calculated as $\Delta Vth=Vth(t_{stress})-Vth(0)$(Vth shift).

8. The process according to claim 4 wherein the stress conditions applied in step (f) include a gate voltage equal to the drain voltage; a source voltage and a well voltage equal to 0V; a temperature set at the in-line test temperature; and a time of stress equal to the amount of in-line testing time allowed.

9. The process according to claim 8 wherein the drain current is measured in reverse saturation with the source voltage, gate voltage, drain voltage, and well voltage equal to zero.

10. The process according to claim 4 wherein, in Step (g), the well current at stress is also measured.

11. The process according to claim 4 wherein the correlation is established in Step (i) by obtaining a statistical linear fit of the log(ΔVth) versus log(ΔI) data.

12. The process according to claim 11 wherein the correlation is established in Step (i) by estimating the linear fit parameters A and B so that $\Delta Vth=10^A \times \Delta I^B$.

13. The process according to claim 4 wherein the in-line channel hot-carrier wafer-level stress tests conducted in Step (j) are run at last metal.

14. The process according to claim 4 wherein the screening criterion is evaluated by comparing the threshold voltage shift calculated in Step (l) with the shift in threshold voltage determined in Step (b).

15. The process according to claim 14 wherein the integrated circuit being manufactured is approved if the absolute value of the threshold voltage shift calculated in Step (l) is greater than the absolute value of the shift in threshold voltage determined in Step (b).

16. A process for in-line testing of a p-type metal-oxide-semiconductor field effect transistor (PMOSFET) device for negative bias thermal instability (NBTI), which degrades the gate oxide of the PMOSFET device, during manufacture of an integrated circuit, the process comprising:

(a) identifying the critical circuits of the integrated circuit to be manufactured that are sensitive to NBTI damage;

(b) determining the NBTI reliability targets which will make the integrated circuit fail, including a shift in threshold voltage (ΔVth) which relates to the end-of-life NBTI reliability criteria;

(c) conducting NBTI stress tests in long channel PMOSFET devices;

(d) measuring threshold voltage (Vth) based on the NBTI stress tests;

(e) calculating threshold voltage shift (ΔVth) from the measured threshold voltage values;

(f) injecting hot holes in short channel PMOSFET devices to apply channel hot-carrier stresses;

(g) measuring drain current based on the applied hot-carrier stresses and the well current at stress;

(h) calculating the normalized percent drain current shift (ΔI) from the measured drain current;

(i) establishing the correlation between the NBTI threshold voltage shift calculated in Step (e) and the normalized percent drain current shift calculated in Step (h), by obtaining a statistical linear fit of the log(ΔVth) versus log(ΔI) data and estimating the linear fit parameters A and B so that $\Delta Vth = 10^A \times \Delta I^B$;

(j) conducting in-line channel hot-carrier wafer-level stress tests on short channel PMOSFET devices in the integrated circuits to be tested;

(k) calculating the normalized percent drain current shift from the tests run in Step (j);

(l) calculating the threshold voltage shift from the correlation established in Step (i) for the normalized percent drain current shift calculated in Step (k); and (m) evaluating the screening criterion.

17. The process according to claim 16 wherein:

the stress conditions applied in step (c) include a gate voltage equal to the voltage at burn in, a source voltage equal to the drain voltage and the well voltage and all are 0V, a temperature set at the highest temperature experienced by the integrated circuit in use, and a time of stress equal to the time needed to reach a threshold voltage shift equal to the NBTI reliability target;

the threshold voltage is measured in reverse saturation with the source voltage, drain voltage, and well voltage equal to zero and the gate voltage at the selected drain current; and the threshold voltage shift is calculated as $\Delta Vth = Vth(t_{stress}) \times Vth(0)(Vth\ shift)$.

18. The process according to claim 16 wherein:

the stress conditions applied in step (f) include a gate voltage equal to the drain voltage, a source voltage and a well voltage equal to 0V, a temperature set at the in-line test temperature, and a time of stress equal to the amount of in-line testing time allowed; and the drain current is measured in reverse saturation with the source voltage, gate voltage, drain voltage, and well voltage equal to zero.

19. The process according to claim 16 wherein the in-line channel hot-carrier wafer-level stress tests conducted in Step (j) are run at last metal.

20. The process according to claim 16 wherein:

the screening criterion is evaluated by comparing the threshold voltage shift calculated in Step (l) with the shift in threshold voltage determined in Step (b); and the integrated circuit being manufactured is approved if the absolute value of the threshold voltage shift calculated in Step (l) is greater than the absolute value of the shift in threshold voltage determined in Step (b).

* * * * *